United States Patent
Koh et al.

(10) Patent No.: US 9,660,075 B2
(45) Date of Patent: May 23, 2017

(54) INTEGRATED CIRCUITS WITH DUAL SILICIDE CONTACTS AND METHODS FOR FABRICATING SAME

(71) Applicant: GLOBALFOUNDRIES, Inc., Grand Cayman (KY)

(72) Inventors: Shao Ming Koh, Clifton Park, NY (US); Guillaume Bouche, Malta, NY (US); Jeremy A. Wahl, Malta, NY (US); Andy C. Wei, Queensbury, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 15/051,734

(22) Filed: Feb. 24, 2016

(65) Prior Publication Data

US 2016/0172493 A1 Jun. 16, 2016

Related U.S. Application Data

(62) Division of application No. 14/167,778, filed on Jan. 29, 2014, now Pat. No. 9,293,462.

(51) Int. Cl.
| | |
|---|---|
| H01L 21/84 | (2006.01) |
| H01L 29/78 | (2006.01) |
| H01L 27/092 | (2006.01) |
| H01L 21/311 | (2006.01) |
| H01L 29/45 | (2006.01) |
| H01L 21/8238 | (2006.01) |
| H01L 29/16 | (2006.01) |
| H01L 29/167 | (2006.01) |

(Continued)

(52) U.S. Cl.
CPC .... *H01L 29/7839* (2013.01); *H01L 21/02532* (2013.01); *H01L 21/31111* (2013.01); *H01L 21/823814* (2013.01); *H01L 21/823821* (2013.01); *H01L 21/823871* (2013.01); *H01L 21/845* (2013.01); *H01L 27/0922* (2013.01); *H01L 27/0924* (2013.01); *H01L 27/1211* (2013.01); *H01L 29/0847* (2013.01); *H01L 29/16* (2013.01); *H01L 29/161* (2013.01); *H01L 29/167* (2013.01); *H01L 29/24* (2013.01); *H01L 29/41791* (2013.01); *H01L 29/45* (2013.01); *H01L 29/456* (2013.01); *H01L 29/665* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 2014/0048888 A1 | 2/2014 | Chen et al. | |
| 2015/0279840 A1* | 10/2015 | Huang | H01L 29/66545 257/384 |

* cited by examiner

*Primary Examiner* — Asok K Sarkar
(74) *Attorney, Agent, or Firm* — Lorenz & Kopf, LLP (57) ABSTRACT

Integrated circuits having silicide contacts with reduced contact resistance and methods for fabricating integrated circuits having silicide contacts with reduced contact resistance are provided. In an embodiment, a method for fabricating an integrated circuit includes providing a semiconductor substrate with fin structures having source/drain regions in PFET areas and in NFET areas. The method includes selectively forming a contact resistance modulation material on the source/drain regions in the PFET areas. Further, the method includes depositing a band-edge workfunction metal overlying the source/drain regions in the PFET areas and in the NFET areas.

19 Claims, 7 Drawing Sheets

(51) Int. Cl.
*H01L 29/161* (2006.01)
*H01L 21/02* (2006.01)
*H01L 29/08* (2006.01)
*H01L 29/24* (2006.01)
*H01L 29/66* (2006.01)
*H01L 29/417* (2006.01)
*H01L 27/12* (2006.01)

INTEGRATED CIRCUITS WITH DUAL SILICIDE CONTACTS AND METHODS FOR FABRICATING SAME

CROSS-REFERENCE TO RELATED APPLICATION

This is a divisional application of U.S. patent application Ser. No. 14/167,778, filed Jan. 29, 2014.

TECHNICAL FIELD

The present disclosure generally relates to integrated circuits and methods for fabricating integrated circuits, and more particularly relates to integrated circuits having contacts with reduced contact resistance and methods for fabricating integrated circuits having contacts with reduced contact resistance.

BACKGROUND

The majority of present day integrated circuits are implemented by using a plurality of interconnected field effect transistors (FETs), also called metal oxide semiconductor field effect transistors (MOSFETs or MOS transistor devices). Such a transistor device typically includes a gate electrode as a control electrode that is formed overlying a semiconductor substrate and spaced-apart source and drain regions that are formed within the semiconductor substrate and between which a current can flow. A control voltage applied to the gate electrode controls the flow of current through a channel in the semiconductor substrate between the source and drain regions and beneath the gate electrode.

The MOS transistor device is accessed via conductive contacts typically formed on the source and drain regions between the gate electrodes of MOS transistor devices. The conductive contacts are usually formed by siliciding a metal on the source/drain regions, depositing an insulating layer over the silicided source/drain regions, and then etching a contact opening in the insulating layer. A thin barrier layer, typically of titanium nitride and/or other metals and alloys, is deposited in the contact opening and the opening then is filled by a chemical vapor deposited layer of tungsten. At reduced technology nodes, more and more circuitry is incorporated on a single integrated circuit chip and the sizes of each individual device in the circuit and the spacing between the devices decrease. However, one of the limiting factors in the continued shrinking of integrated semiconductor devices is the resistance of contacts to doped regions such as the source and drain regions. As device sizes decrease, the width of contacts decreases. As the width of the contacts decreases, the resistance of the contacts becomes increasingly larger. In turn, as the resistance of the contacts increases, the drive current of the devices decreases, thus adversely affecting device performance. Therefore, the importance of reducing contact resistance at source/drain regions is amplified at reduced technology nodes.

Accordingly, it is desirable to provide integrated circuits and methods for fabricating integrated circuits that exhibit lower contact resistance. In addition, it is desirable to provide integrated circuits and methods for fabricating integrated circuits that utilize a single metal layer to form contact interfaces with source/drain regions in both PFET areas and NFET areas. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits having contacts with reduced contact resistance and methods for fabricating integrated circuits having contacts with reduced contact resistance are provided. In accordance with one embodiment, a method for fabricating an integrated circuit includes providing a semiconductor substrate with fin structures having source/drain regions in PFET areas and in NFET areas. The method includes selectively forming a contact resistance modulation material on the source/drain regions in the PFET areas. Further, the method includes depositing a band-edge workfunction metal overlying the source/drain regions in the PFET areas and in the NFET areas.

In another embodiment, a method for fabricating an integrated circuit includes providing a semiconductor substrate with fin structures having source/drain regions in PFET areas and in NFET areas. The method deposits a dielectric material over the source/drain regions in PFET areas and in NFET areas. Further, the method etches the dielectric material to expose the source/drain regions in PFET areas and in NFET areas. The method includes selectively forming a contact resistance modulation material on the source/drain regions in PFET areas. Also, the method includes depositing a band-edge workfunction metal overlying the source/drain regions in PFET areas and overlying the source/drain regions in NFET areas.

In accordance with another embodiment, an integrated circuit is provided. The integrated circuit includes a semiconductor substrate having an NFET area and a PFET area. The integrated circuit includes a source/drain region in the NFET area and a silicide contact on the source/drain region in the NFET area. Further, the integrated circuit includes a source/drain region in the PFET area, a germanium layer on the source/drain region in the PFET area, and a silicide contact on the germanium layer.

BRIEF DESCRIPTION OF THE DRAWINGS

Embodiments of integrated circuits having contacts with reduced contact resistance and methods for fabricating integrated circuits having contacts with reduced contact resistance will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits having contacts with reduced contact resistance and methods for fabricating integrated circuits having contacts with reduced contact resistance are provided. Specifically, integrated circuits described herein are provided with contacts to source/drain regions in P-channel FETs (PFETs) and N-channel FETs (NFETs) with reduced contact resistance. The contacts in the PFETs and NFETs are formed from a same metal layer. To provide reduced contact resistance in the PFETs and NFETs, the source/drain regions are processed unconventionally such that formation of contacts from a same metal creates contacts with optimized electrical properties, e.g., optimized Schottky barrier heights in both the PFETs or NFETs. In an exemplary embodiment, a method for fabricating an integrated circuit includes forming a contact resistance modulation material over selected source/drain regions, such as source/drain regions in the PFETs. The contact resistance modulation material for the PFET contacts provides for a reduction in contact resistance by providing a strong Fermi level pinning effect leading to high electron Schottky barrier height and low hole Schottky barrier height regardless of the overlying metal workfunction value. As a result, the metal may be selected for optimized Schottky barrier height in the NFETs without leading to increased contact resistance in the PFETs. In this manner, contacts in PFETs and in NFETs can be optimized to reduce contact resistance and improve device performance.

FIGS. 1-19 illustrate methods for fabricating integrated circuits having contacts with reduced contact resistance in accordance with various embodiments herein. FIGS. 1-6 illustrate steps for forming desired source/drain regions in PFETs and NFETs. FIGS. 7-11 illustrate a method for forming contacts with reduced contact resistance on source/drain regions in PFETs and NFETs. FIGS. 12-19 illustrate an alternate method for forming contacts with reduced contact resistance on source/drain regions in PFETs and NFETs. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
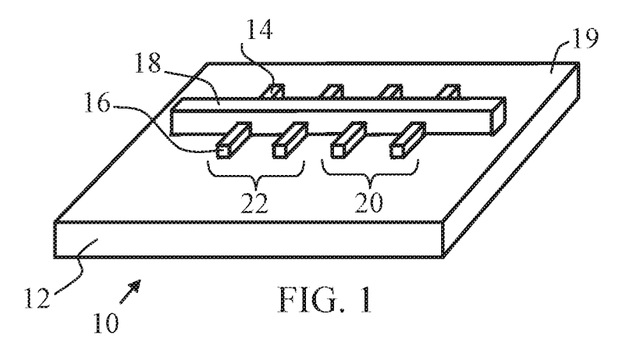
FIG. 1 illustrates, in perspective view, a portion of an integrated circuit having a non-planar multi-gate transistor in accordance with an embodiment herein.

Turning to FIG. 1, in an exemplary embodiment, the method for fabricating an integrated circuit 10 includes providing a semiconductor substrate 12. The semiconductor substrate 12 is formed from a semiconductor material such, for example, silicon, including the relatively pure silicon materials typically used in the semiconductor industry as well as silicon admixed with other elements, such as germanium and the like. Alternatively, the semiconductor substrate 12 can be realized as germanium, gallium arsenide, and the like, or the semiconductor substrate 12 can include layers of different semiconductor materials. The semiconductor substrate 12 may be realized as a bulk silicon or silicon-on-insulator (SOI) wafer. Structures 14, such as fin structures, are formed on and/or from the semiconductor substrate 12. Each fin structure 14 has source/drain regions 16 that are defined in relation to a gate 18. The fin structures 14 are formed according to known processes. For instance, when using a silicon-on-oxide semiconductor substrate 12, portions of the top silicon layer are etched or otherwise removed leaving the fin structures 14 formed from the remaining silicon on the underlying oxide layer 19. As shown, gate 18 is formed across the fin structures 14. Gate oxide and/or nitride capping layers (not shown) may be deposited over the fin structures 14 before the gate 18 is formed. The gate 18 is formed by typical lithographic processing. The fin structures 14 are formed in a PFET area 20 and NFET area 22 defined on the semiconductor substrate 12.

Figure 2:
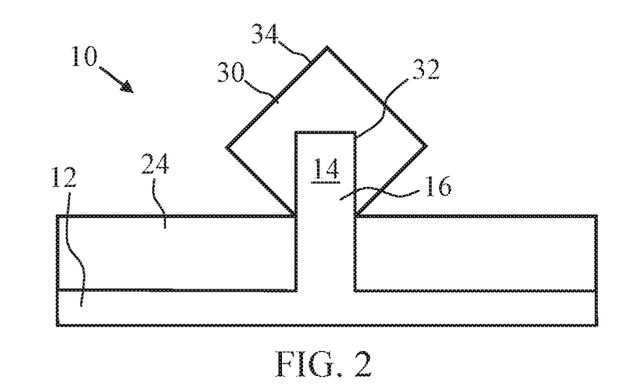
FIGS. 2-6 illustrate, in cross section, a portion of an integrated circuit and method steps for fabricating an integrated circuit with a desired source/drain region in accordance with various embodiments herein.

FIGS. 2-6 are cross-sectional views of a source/drain region 16 in one of the fin structures 14 of FIG. 1 during various steps of processing. In FIG. 2, the exemplary fin structure 14 has been formed and an isolation layer 24, such as oxide, has been formed over the semiconductor substrate 12. In an exemplary embodiment, a selective epitaxial growth process forms an additional layer 30 on exposed silicon surfaces 32 of the fin to form an enhanced fin structure 34. The additional layer 30 may comprise silicon, silicon germanium, or other material suitable for a source/drain region 16 in a PFET or NFET area. As shown, the additional layer 30 may provide the fin structure 34 with a "diamond-shaped" cross-section that occurs due to the slower rate of growth on the (111) surface.

Figure 3:
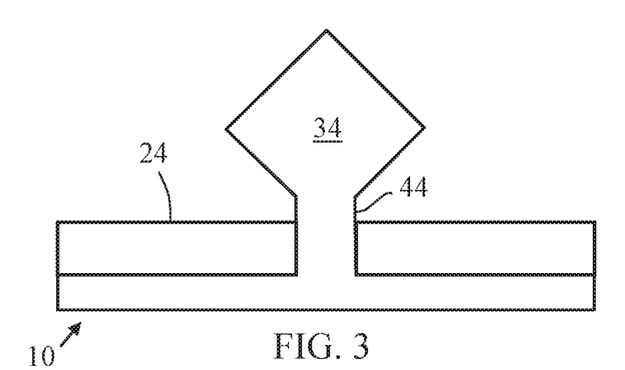
Figure 4:
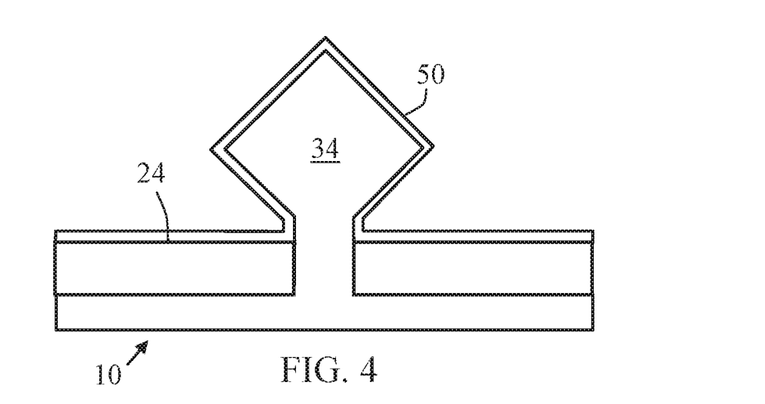

In the illustrated embodiment of FIG. 3, the isolation layer 24 is recessed to expose a vertical portion 44 of the fin structure 34. In an exemplary embodiment, the isolation layer 24 is recessed using a combination of highly selective dry etch and wet etch with etchant such as buffered hydrofluoric acid during a pre-clean process. In FIG. 4, a non-silicon layer 50, or masking layer, is formed over the isolation layer 24 and the fin structure 34. In an exemplary embodiment, the non-silicon layer 50 is silicon oxide or silicon nitride, and is conformally deposited, such as by atomic layer deposition (ALD) or chemical vapor deposition (CVD). The non-silicon layer 50 may have a thickness of about 2 nanometers (nm) to about 10 nm in an exemplary embodiment. As shown in FIG. 4, the fin structure 34 is encapsulated by the non-silicon layer 50.

Figure 5:
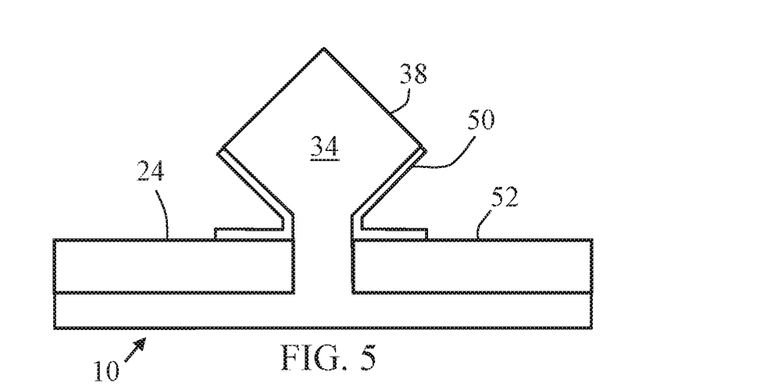

In FIG. 5, an etch process is performed to remove the non-silicon layer 50 formed on the upper surfaces 38 of the fin structure 34. In an exemplary method, an anisotropic dry etch is performed and removes the non-silicon layer 50 from the upper surfaces 38, as well as from a non-covered portion 52 of the isolation layer 24. The etch process also serves to pre-clean the upper surfaces 38. Further processing of the fin structure 34 may include the implantation of ions to selectively dope the fin structure 34 as desired for use in a PFET area or NFET area.

Figure 6:
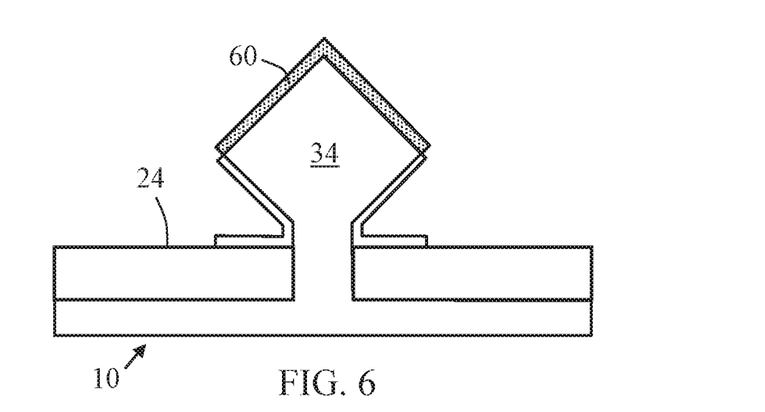

The method may continue in FIG. 6 with an optional step (at this stage of fabrication) of forming a contact resistance modulation material 60 overlying the fin structure 34. In an exemplary embodiment, the contact resistance modulation material 60 is epitaxially grown on the fin structure 34. For example, for a fin structure 34 located in a PFET area and formed with silicon germanium, germanium may be epitaxially grown on the fin structure 34. Most metals form low Schottky barrier on germanium and this allows reduced contact resistance or improved electrical connection between the source/drain and the metallic contact. The contact resistance modulation material 60 may be formed with a thickness of about 5 nm to about 15 nm. To selectively form the contact resistance modulation material 60 on selected fin structures 34, non-selected fin structures (not shown) located elsewhere on the semiconductor substrate may be covered by a hardmask. The hardmask exposes the selected fin structures 34, such that the contact resistance modulation material 60 is formed on the selected fin structures 34 when an epitaxial vapor or liquid is contacted with the partially completed integrated circuit 10.

Figure 7:
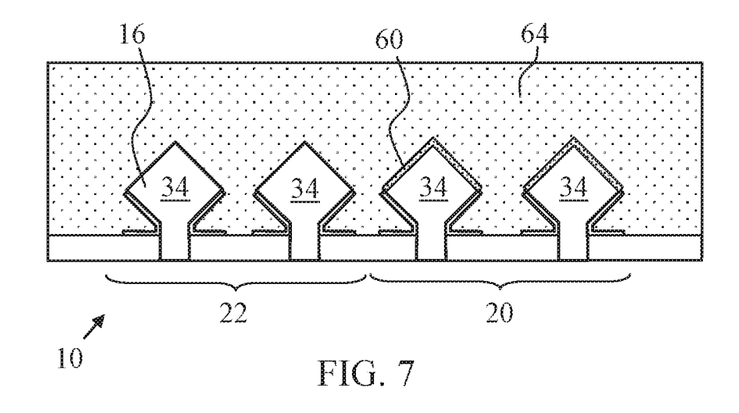
FIGS. 7-11 illustrate a portion of an integrated circuit and method steps for fabricating an integrated circuit with contacts having reduced contact resistance in accordance with an embodiment herein.

Referring now to FIGS. 7-11, contacts with reduced contact resistance are formed on the source/drain regions 16 of the fin structures 34 in the PFET and NFET areas. In FIG. 7, fin structures 34 are shown formed in a PFET area 20 and an NFET area 22 according to the steps of FIGS. 2-6. In an exemplary embodiment, the fin structures 34 in the PFET area 20 are formed according to FIG. 6 with silicon germanium as the additional layer 30 (shown in FIG. 2) and germanium as the contact resistance modulation material 60 (as formed according to FIG. 6). The exemplary fin structures 34 in the NFET area 22 are formed with silicon as the additional layer 30 (shown in FIG. 2) and without a contact resistance modulation material according to FIG. 5. The fin structures 34 in the NFET area 22 may be doped, such as with phosphorus, as desired. As shown, an interlayer dielectric material 64 is deposited over the partially completed integrated circuit 10. An exemplary interlayer dielectric material 64 is silicon oxide. In an exemplary embodiment, the interlayer dielectric material 64 is deposited by chemical vapor deposition (CVD).

Figure 8:
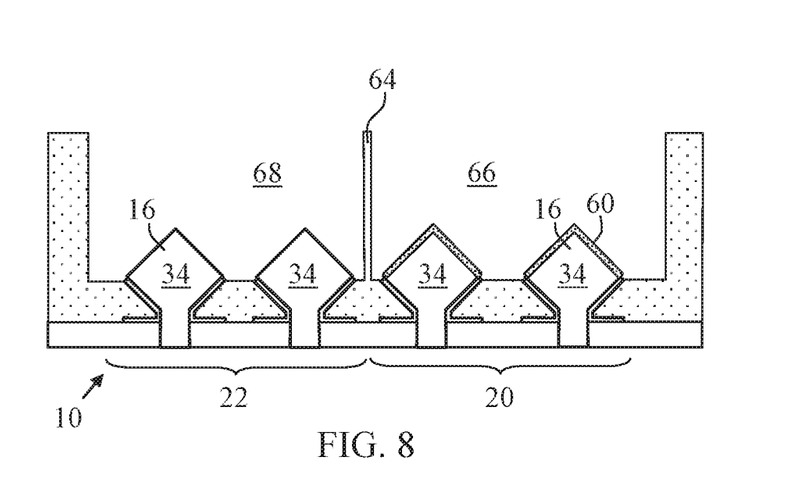

In FIG. 8, the interlayer dielectric material 64 is etched to expose selected areas of the partially completed integrated circuit 10, such as source/drain regions 16 of fin structures 34 in PFET area 20 and NFET area 22. An exemplary etch process is anisotropic and is performed through a photomask (not shown) to selectively etch the interlayer dielectric material 64. In the exemplary embodiment of FIG. 8, a trench 66 is formed over the PFET area 20 and a trench 68 is formed over the NFET area 22. Trenches 66 and 68 are separated from one another by a portion of the interlayer dielectric material 64, though in certain embodiments, a single trench may be formed overlying by the PFET area 20 and the NFET area 22.

Figure 9:
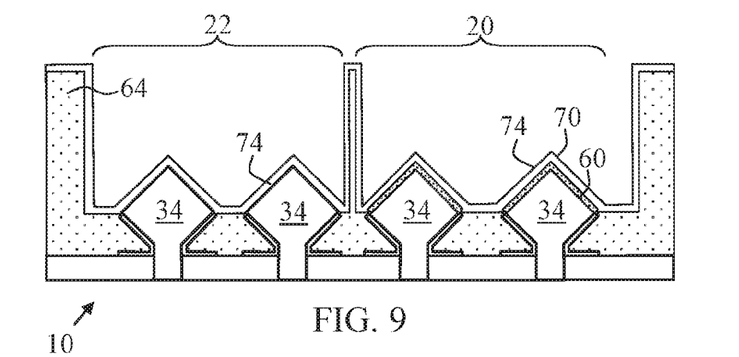

In an exemplary embodiment, the method continues in FIG. 9 with the deposition of a metal layer 70 over the partially completed integrated circuit 10. Specifically, the metal layer 70 may be conformally deposited over the interlayer dielectric material 64 and the fin structures 34. In an exemplary embodiment, the metal layer 70 is a band-edge workfunction metal, for example aluminum, erbium, ytterbium, titanium, yttrium, dysprosium, tantalum, and their alloys, carbides, and nitrides, or other suitable metals. Such band-edge workfunction metals act as a source/drain contact to reduce metal/silicon contact resistance. The band-edge metal may be selected to reduce or minimize the Schottky barrier height, i.e., the difference between the metal workfunction and the semiconductor (e.g., Si, SiGe or Ge) electron affinity in the PFET area 20 and the NFET area 22. Optionally, an anneal may be performed to form silicide contacts 74 from the metal layer 70 and the contact resistance modulation material 60 in the PFET area 20 and from the metal layer 70 and the fin structure 34 in the NFET area 22. The anneal process may partially consume the contact resistance modulation material 60.

Figure 10:
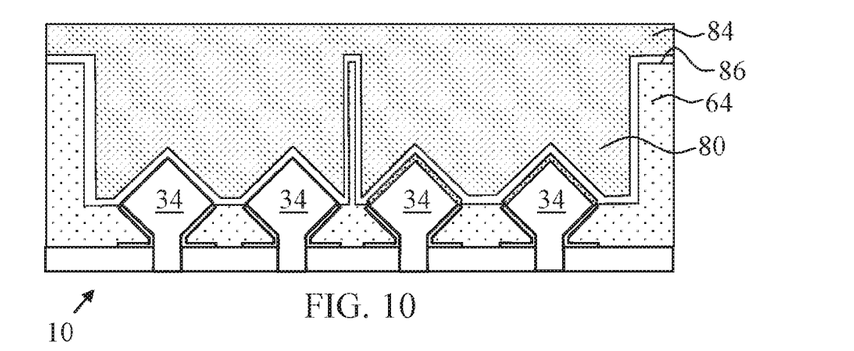
Figure 11:
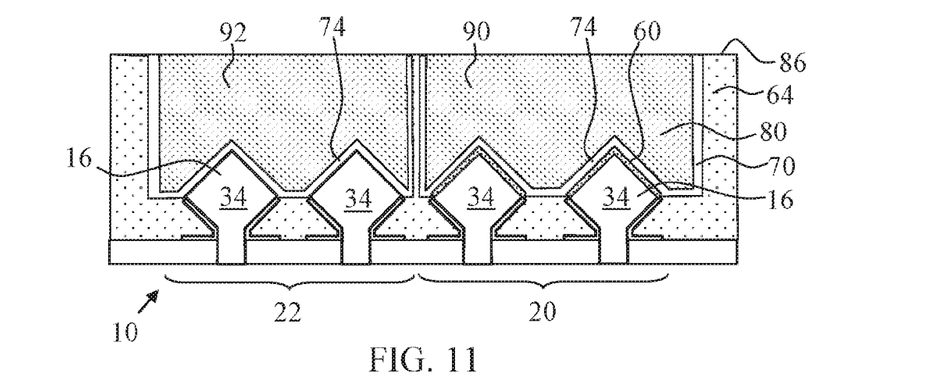

In FIG. 10, a fill metal 80 is deposited over the partially completed integrated circuit 10. An exemplary fill metal 80 is tungsten, though copper or any other suitable conductive metal that is easy to deposit and polish may be used. The fill metal 80 may be conformally deposited such as by CVD. As shown, the fill metal 80 forms an overburden portion 84 located above the upper surface 86 of the interlayer dielectric material 64. In FIG. 11, the overburden portion 84 is removed, for example by a chemical mechanical planarization (CMP) process. As shown, the portion of the metal layer 70 overlying the upper surface 86 of the interlayer dielectric material 64 is also removed by the CMP process. If not performed earlier, an anneal process may be performed before or after the CMP process to form silicide contacts 74 from the metal layer 70 and the contact resistance modulation material 60 in the PFET area 20 and from the metal layer 70 and the fin structure 34 in the NFET area 22. Again, the anneal process may partially consume the contact resistance modulation material 60. In FIG. 11, a contact structure 90 is formed from the silicide contacts 74, metal layer 70 and fill metal 80 and is in contact with the source/drain regions 16 in the fin structures 34 in the PFET area 20. Further, a contact structure 92 is formed from the silicide contacts 74, metal layer 70 and fill metal 80 and is in contact with the source/drain regions 16 in the fin structures 34 in the NFET area 22.

Figure 12:
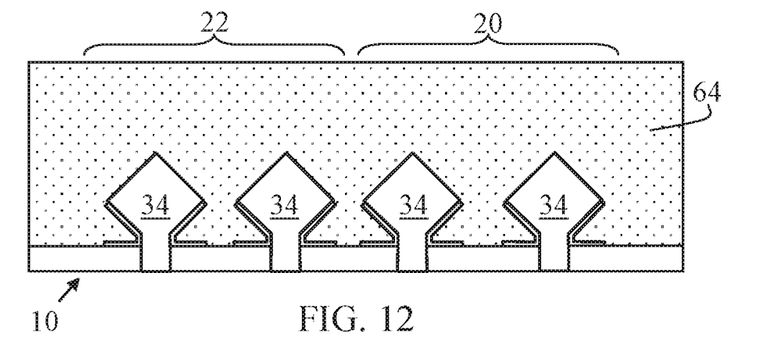
FIGS. 12-19 illustrate a portion of an integrated circuit and method steps for fabricating an integrated circuit with contacts having reduced contact resistance in accordance with an alternate embodiment herein.

Referring now to FIGS. 12-19, an alternate embodiment of a method for forming contacts with reduced contact resistance is provided. In FIG. 12, fin structures 34 are shown formed in a PFET area 20 and an NFET area 22 according to the steps of FIGS. 2-5. Notably, the contact resistance modulation material 60 has not been formed as shown in FIG. 6. In the exemplary embodiment of FIG. 12, the fin structures 34 in the PFET area 20 are formed according to FIG. 5 with silicon germanium as the additional layer 30 (shown in FIG. 2) while the exemplary fin structures 34 in the NFET area 22 are formed with silicon as the additional layer 30 (shown in FIG. 2). The fin structures 34 in the NFET area 22 may be doped, such as with phosphorus, as desired. As shown, an interlayer dielectric material 64 is deposited over the partially completed integrated circuit 10.

Figure 13:
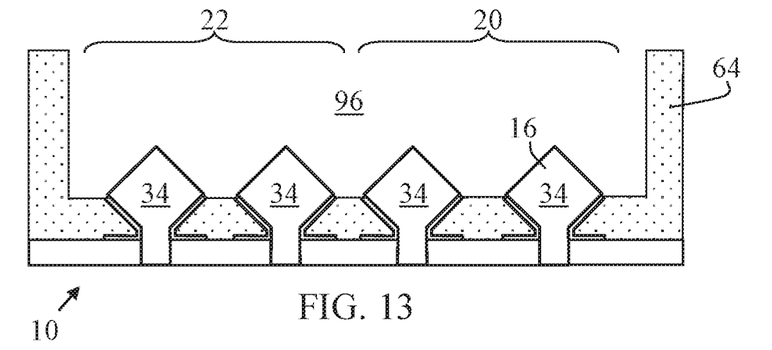

In FIG. 13, the interlayer dielectric material 64 is etched to expose selected areas of the partially completed integrated circuit 10, such as source/drain regions 16 of fin structures 34 in PFET area 20 and NFET area 22. An exemplary etch process is anisotropic and is performed through a photomask (not shown) to selectively etch the interlayer dielectric material 64. In the exemplary embodiment of FIG. 13, a single continuous trench 96 is formed over the PFET area 20 and NFET area 22, though in certain embodiments, a selectively reactive ion etch process using etchant, such as hexafluorobutadiene for example, is performed to form separate trenches overlying the PFET area 20 and the NFET area 22.

Figure 14:
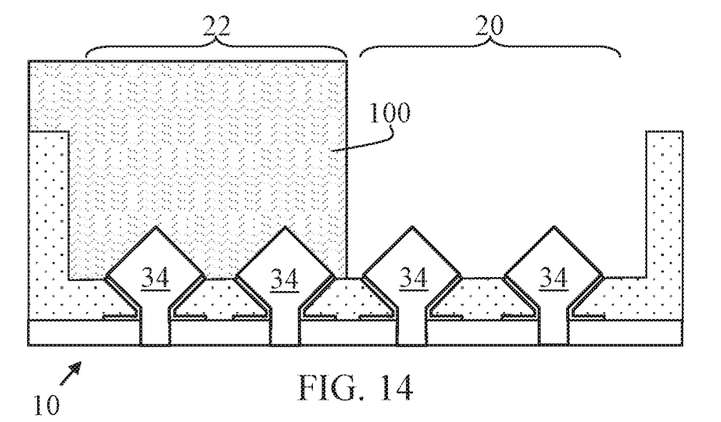
Figure 15:
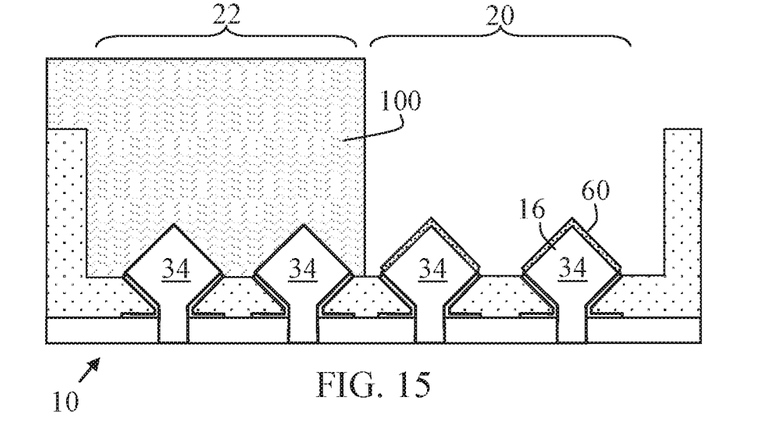
Figure 16:
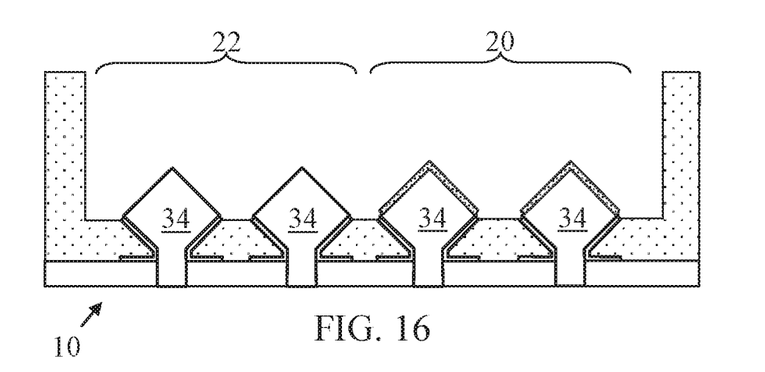

The method may continue in FIG. 14 with the formation of a hardmask 100 over the NFET area 22. For example, silicon nitride may be deposited over the partially completed integrated circuit 10 and selectively patterned to expose the PFET area 20. As shown in FIG. 15, a contact resistance modulation material 60 is formed on the source/drain regions 16 of the fin structures 34 in the PFET area 20. In an exemplary embodiment, the contact resistance modulation material 60 is epitaxially grown on the fin structures 34. For example, for a fin structure 34 located in a PFET area 20 and formed with silicon germanium, germanium may be epitaxially grown on the fin structure 34. The contact resistance modulation material 60 may be formed with a thickness of about 5 nm to about 15 nm. As shown, to selectively form the contact resistance modulation material 60 only on selected fin structures 34 in the PFET area 20, non-selected fin structures 34 in the NFET area 22 are covered by the hardmask 100. In FIG. 16, the hardmask 100 is removed from the NFET area 22.

Figure 17:
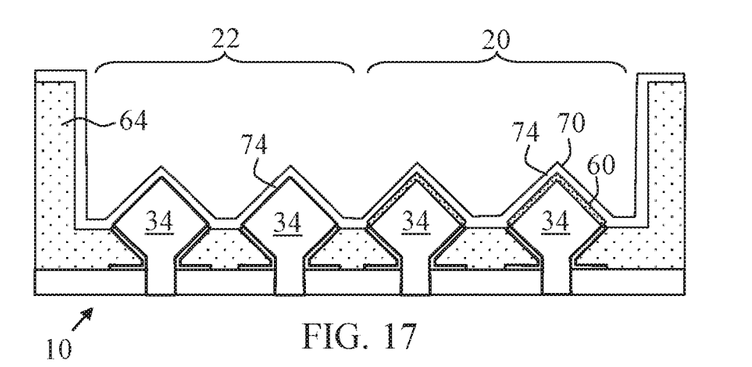

Next, as illustrated FIG. 17, a metal layer 70 is deposited over the partially completed integrated circuit 10. Specifically, the metal layer 70 may be conformally deposited, for example by an ALD or PVD process, over the interlayer dielectric material 64 and the fin structures 34. In an exemplary embodiment, the metal layer 70 is a band-edge workfunction metal, for example aluminum, erbium, ytterbium, titanium, yttrium, dysprosium, tantalum, and their alloys, carbides, and nitrides, or other suitable metals, that act as a source/drain contact to reduce metal/silicon contact resistance. As stated above, the band-edge metal may be selected to reduce or minimize the Schottky barrier height, i.e., the difference between the metal workfunction and the semiconductor (e.g., Si, SiGe or Ge) electron affinity in the PFET area 20 and the NFET area 22. Optionally, an anneal may be performed to form silicide contacts 74 from the metal layer 70 and the contact resistance modulation material 60 in the PFET area 20 and from the metal layer 70 and the fin structure 34 in the NFET area 22. The anneal process may partially consume the contact resistance modulation material 60.

Figure 18:
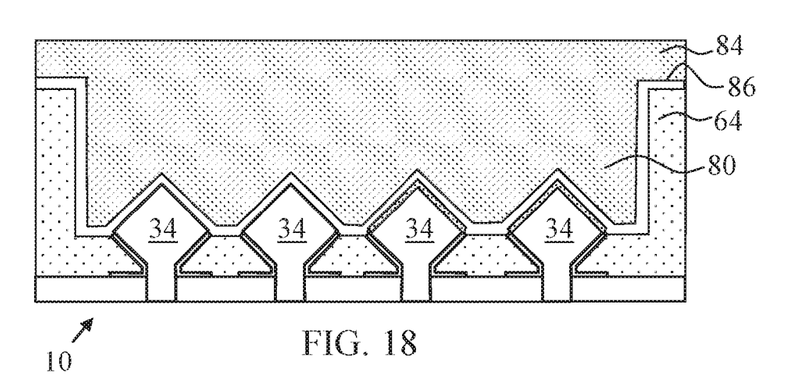
Figure 19:
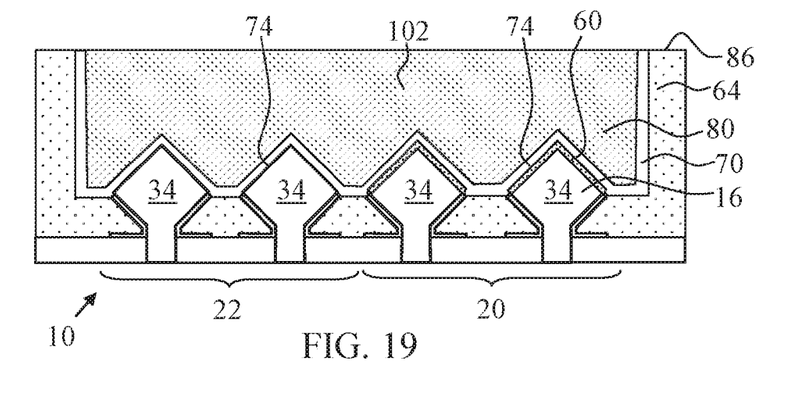

A fill metal 80 is deposited over the partially completed integrated circuit 10, as shown in FIG. 18. An exemplary fill metal 80 is tungsten, though copper or any other suitable conductive metal that is easy to deposit and polish may be used. The fill metal 80 may be conformally deposited such as by CVD. As shown, the fill metal 80 forms an overburden portion 84 located above the upper surface 86 of the interlayer dielectric material 64. In FIG. 19, the overburden portion 84 is removed, for example by a chemical mechanical planarization (CMP) process. As shown, the portion of the metal layer 70 overlying the upper surface 86 of the interlayer dielectric material 64 is also removed by the CMP process. If not performed earlier, an anneal process may be performed before or after the CMP process to form silicide contacts 74 from the metal layer 70 and the contact resistance modulation material 60 in the PFET area 20 and from the metal layer 70 and the fin structure 34 in the NFET area 22. The anneal process may partially consume the contact resistance modulation material 60. In FIG. 19, a contact structure 102 is formed in contact with the source/drain regions 16 of the fin structures 34 in the PFET area 20 and the NFET area 22.

Each of the embodiments disclosed herein forms a contact resistance modulation material on selected source/drain regions and forms a metal layer overlying selected and non-selected source/drain regions. In the exemplary embodiments, the selected source/drain regions are in the PFET area while the non-selected source/drain regions are in the NFET area; however, the selected source/drain regions may be in the NFET area and the non-selected source/drain regions may be in the PFET area, or the selected and non-selected source/drain regions may each be in both PFET and NFET areas. Also, the contact structures formed according to the methods herein may contact a single source/drain region, source/drain regions in either a PFET or an NFET area, or source/drain regions in both PFET and NFET areas. Further, the integrated circuit may be annealed to form silicide contacts at the interface of the metal layer and the contact resistance modulation material on selected source/drain regions and at the interface of the metal layer and the non-selected source/drain regions.

As described herein, an integrated circuit fabrication process is implemented to form improved contacts to source/drain regions. Specifically, contacts are formed between a metal layer and a contact resistance modulation material over source/drain regions in a PFET area and between the same metal layer and source/drain regions in an NFET area. Despite the use of the same metal for both the PFET and NFET area, electrical properties such as Schottky barrier height are optimized for both PFET and NFET contacts. Specifically, the contact resistance modulation material at the PFET contacts provides for a reduction in contact resistance by providing a strong Fermi level pinning effect leading to high electron Schottky barrier height and low hole Schottky barrier height regardless of the metal workfunction value. As a result, the metal may be selected for optimized Schottky barrier height in the NFET area without leading to increased contact resistance in the PFET area. Thus, contact resistance in both PFET and NFET areas are reduced and PFET and NFET device performance is optimized.

The fabrication methods described herein result in integrated circuits having source/drain contacts with reduced contact resistance. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a semiconductor substrate with fin structures having PFET source/drain regions and NFET source/drain regions, wherein the fin structures have upper surfaces;
   selectively forming a contact resistance modulation material on the upper surfaces of the fin structures in the PFET source/drain regions; and
   depositing a band-edge workfunction metal overlying the PFET source/drain regions and the NFET source/drain regions.

2. The method of claim 1 further comprising annealing the band-edge workfunction metal to form silicide contacts over the PFET and the NFET source/drain regions.

3. The method of claim 1 wherein selectively forming a contact resistance modulation material on the upper surfaces of the fin structures in the PFET source/drain regions comprises epitaxially growing germanium on the upper surfaces of the fin structures in the PFET source/drain regions.

4. The method of claim 1 wherein the NFET source/drain regions comprise phosphorus-doped silicon, wherein the PFET source/drain regions comprise silicon germanium, and wherein selectively forming a contact resistance modulation material on the upper surfaces of the fin structures in the PFET source/drain regions comprises epitaxially growing germanium on the upper surfaces of the fin structures in the PFET source/drain regions.

5. The method of claim 1 wherein:
   depositing a band-edge workfunction metal overlying the PFET source/drain regions and the NFET source/drain regions comprises forming a continuous layer over the PFET source/drain regions and over the NFET source/drain regions; and
   the method further comprises depositing a contact metal onto the continuous metal layer over the PFET source/drain regions and over the NFET source/drain regions.

6. The method of claim 1 wherein:
each fin structure has an upper portion extending from a first height to a second height greater than the first height;
the upper surfaces of each fin structure extend from the first height to the second height; and
selectively forming a contact resistance modulation material on the upper surfaces of the fin structures in the PFET source/drain regions comprises selectively forming a contact resistance modulation material on the upper surfaces of the fin structures in the PFET source/drain regions from the first height to the second height.

7. The method of claim 1 wherein:
each fin structure has an upper portion extending from a first height to a second height greater than the first height; and
selectively forming a contact resistance modulation material on the upper surfaces of the fin structures in the PFET source/drain regions comprises selectively forming a contact resistance modulation material over and laterally adjacent to the upper portion of each fin structure.

8. The method of claim 1 wherein the method further comprises:
depositing an interlayer dielectric overlying the semiconductor substrate; and
etching the interlayer dielectric to expose the PFET source/drain regions and the NFET source/drain regions, wherein depositing the band-edge workfunction metal overlying the PFET source/drain regions and the NFET source/drain regions comprises depositing a continuous metal layer extending from over the PFET source/drain regions to over the NFET source/drain regions.

9. The method of claim 1 wherein the method further comprises:
depositing an interlayer dielectric overlying the semiconductor substrate;
etching the interlayer dielectric to expose the PFET source/drain regions and the NFET source/drain regions, wherein depositing the band-edge workfunction metal overlying the PFET source/drain regions and the NFET source/drain regions comprises depositing a continuous metal layer over the PFET source/drain regions and over the NFET source/drain regions; and
the method further comprises depositing a contact metal onto the continuous metal layer over the PFET source/drain regions and over the NFET source/drain regions.

10. The method of claim 1 further comprising removing oxide from a surface of the contact resistance modulation material before depositing the band-edge workfunction metal overlying the PFET source/drain regions and the NFET source/drain regions.

11. The method of claim 1 wherein providing the semiconductor substrate with fin structures having source/drain regions in PFET areas and in NFET areas comprises forming each source/drain region with a diamond-shaped cross-section, wherein the upper surfaces intersect lower surfaces at a maximum cross-section.

12. The method of claim 11 wherein selectively forming the contact resistance modulation material on the PFET source/drain regions comprises selectively forming the contact resistance modulation material on the upper surfaces of each PFET source/drain region and preventing formation of the contact resistance modulation material on the lower surfaces of each PFET source/drain region.

13. The method of claim 12 wherein selectively forming the contact resistance modulation material on the upper surfaces of each PFET source/drain region and preventing formation of the contact resistance modulation material on the lower surfaces of each PFET source/drain region comprises forming a masking layer on the lower surfaces of each PFET source/drain region.

14. The method of claim 13 wherein the method further comprises depositing an interlayer dielectric overlying the upper surfaces of each source/drain region and overlying the masking layer on the lower surface of each PFET source/drain region.

15. The method of claim 14 wherein the method further comprises etching the interlayer dielectric to expose the upper surfaces of each source/drain region.

16. The method of claim 14 wherein
depositing a band-edge workfunction metal overlying the PFET source/drain regions and the NFET source/drain regions comprises forming a continuous layer over the PFET source/drain regions and over the NFET source/drain regions; and
the method further comprises depositing a contact metal onto the continuous metal layer over the PFET source/drain regions and over the NFET source/drain regions.

17. A method for fabricating an integrated circuit, the method comprising:
providing a semiconductor substrate with fin structures having source/drain regions in PFET areas and in NFET areas;
depositing a dielectric material over and between the source/drain regions in PFET areas and in NFET areas;
etching the dielectric material to expose the source/drain regions in PFET areas and in NFET areas and to define exposed surface regions of the dielectric material between the source/drain regions;
selectively forming a contact resistance modulation material on the source/drain regions in PFET areas;
depositing a band-edge workfunction metal overlying the source/drain regions and the surface regions of the dielectric material in PFET areas and in NFET areas; and
depositing a contact metal fill on the band-edge workfunction metal overlying the source/drain regions and on the band-edge workfunction metal overlying the source/drain regions.

18. The method of claim 17 wherein: the band-edge workfunction metal completely separates the metal fill from the source/drain regions and from the surface regions of the dielectric material.

19. The method of claim 17 wherein: depositing the band-edge workfunction metal overlying the source/drain regions and the surface regions of the dielectric material in the PFET areas and in the NFET areas comprises depositing a continuous metal layer extending over the source/drain regions and the surface regions of the dielectric material in the PFET areas and in the NFET areas.

* * * * *